US008541847B2

(12) United States Patent
An et al.

(10) Patent No.: US 8,541,847 B2
(45) Date of Patent: Sep. 24, 2013

(54) SEMICONDUCTOR DEVICE AND METHOD FOR FABRICATING THE SAME

(75) Inventors: Xia An, Beijing (CN); Yue Guo, Beijing (CN); Quanxin Yun, Beijing (CN); Ru Huang, Beijing (CN); Xing Zhang, Beijing (CN)

(73) Assignee: Peking University, Beijing (CN)

( * ) Notice: Subject to any disclaimer, the term of this patent is extended or adjusted under 35 U.S.C. 154(b) by 101 days.

(21) Appl. No.: 13/201,618

(22) PCT Filed: Sep. 25, 2010

(86) PCT No.: PCT/CN2010/077248
§ 371 (c)(1),
(2), (4) Date: Aug. 15, 2011

(87) PCT Pub. No.: WO2011/113268
PCT Pub. Date: Sep. 22, 2011

(65) Prior Publication Data
US 2012/0187495 A1 Jul. 26, 2012

(30) Foreign Application Priority Data
Mar. 15, 2010 (CN) .......................... 2010 1 0125795

(51) Int. Cl.
*H01L 27/088* (2006.01)
*H01L 21/336* (2006.01)

(52) U.S. Cl.
USPC 257/368; 257/401; 257/E27.06; 257/E21.409; 438/306

(58) Field of Classification Search
USPC .................... 257/368, 401, E27.06, E21.409; 438/306
See application file for complete search history.

(56) References Cited

U.S. PATENT DOCUMENTS

| 4,855,246 A * | 8/1989 | Codella et al. ................ 438/185 |
| 7,615,435 B2 | 11/2009 | Gluschenkov et al. |
| 7,625,801 B2 | 12/2009 | Wu et al. |

(Continued)

FOREIGN PATENT DOCUMENTS

| CN | 1828934 A | 9/2006 |
| CN | 101150070 A | 3/2008 |
| CN | 101359685 A | 2/2009 |
| EP | 1763084 A2 | 3/2007 |

*Primary Examiner* — Victor A Mandala
(74) *Attorney, Agent, or Firm* — Bozicevic, Field & Francis LLP; Bret E. Field

(57) ABSTRACT

The present invention provides a semiconductor device and a method for fabricating the same, wherein the method comprises: providing a germanium-based semiconductor substrate having a plurality of active regions and device isolation regions between the plurality of active regions, wherein a gate dielectric layer and a gate over the gate dielectric layer are provided on the active regions, and the active regions include source and drain extension regions and deep source and drain regions; performing a first ion implantation process with respect to the source and drain extension regions, wherein the ions implanted in the first ion implantation process include silicon or carbon; performing a second ion implantation process with respect to the source and drain extension regions; performing a third ion implantation process with respect to the deep source and drain regions; performing an annealing process with respect to the germanium-based semiconductor substrate which has been subjected to the third ion implantation process. According to the method for fabricating a semiconductor device, through the implantation of silicon impurities, appropriate stress may be introduced into the germanium channel effectively by the mismatch of lattices in the source and drain regions, so that the mobility of electrons in the channel is enhanced and the performance of the device is improved.

11 Claims, 6 Drawing Sheets

(56) References Cited

U.S. PATENT DOCUMENTS

| | | |
|---|---|---|
| 7,825,493 B2 | 11/2010 | Ikeda |
| 2005/0179091 A1* | 8/2005 | Nishiyama et al. ............ 257/368 |
| 2008/0305598 A1* | 12/2008 | Horsky et al. ................. 438/303 |
| 2009/0004805 A1* | 1/2009 | Nandakumar et al. ........ 438/306 |
| 2009/0081843 A1* | 3/2009 | Sayama et al. ................ 438/301 |
| 2010/0171180 A1* | 7/2010 | Zhang et al. .................. 257/369 |
| 2010/0244139 A1* | 9/2010 | Bryant et al. ................. 257/368 |
| 2010/0252887 A1* | 10/2010 | Nandakumar et al. ........ 257/368 |
| 2011/0223737 A1* | 9/2011 | Liu et al. ....................... 438/308 |

\* cited by examiner

SEMICONDUCTOR DEVICE AND METHOD FOR FABRICATING THE SAME

FIELD OF THE INVENTION

The present invention relates to the field of ultra large scale integrated circuit fabrication technology, and in particular, relates to a method for fabricating a semiconductor device.

BACKGROUND OF THE INVENTION

The development of the semiconductor technology has substantially been following the Moore's Law for over 40 years, and the main approach for improving the speed of the metal-oxide-semiconductor field effect transistors (MOSFET) and reducing the production cost is scalingdown of the geometric dimension of the device. With the development of the integrated circuit and scalingdown of the device size, some problems which can not be ignored have arisen, for example, increasing of the longitudinal electric field of a channel, the roughness of the interface between the gate oxidation layer which becomes increasingly thinner and the silicon substrate becoming worse, and increasing of the scattering of the channel impurities, etc., all of which deteriorate the mobility of the charge carriers. In order to provide relatively large driving current to ensure relatively high speed of a device, reduction of driving current caused by the deterioration of the mobility is a problem difficult to handle and urgently to be solved.

Compared with silicon material, the mobility of holes in germanium material under a low electric field is 4 times as large as that in the silicon material, and the mobility of electrons in the germanium material is 3 times as large as that in the silicon material. Therefore, as a novel material for channel, the germanium material becomes one of the promising candidates in high speed MOSFET device due to its higher and more symmetrical mobility of charge carriers, which is also a hot topic of current research.

Further, in addition to applying novel channel material (such as germanium) to increase the mobility of charge carriers, strain technology is also a good choice. The mobility of charge carriers in the channel may be increased so as to enhance the driving current and improve the performance of a device by applying stress in a channel of the device and changing the band structure of the semiconductor through methods such as altering the material, structure or process of the device, etc. Wherein, the process induced strain method due to its convenient and effective characteristics becomes a method for introducing strain which is currently widely used in mass production in the industry. With respect to the NMOS device, the strain technology may introduce a uniaxial tensile stress in the direction parallel to the channel plane and also may simultaneously introduce a compressive stress in the direction perpendicular to the channel plane, so as to increase the mobility of the electrons in the channel.

To sum up, how to increase the mobility of charge carriers in the channel is one of the difficulties urgently to be solved in conventional ultra large scale integrated circuit fabrication technology.

SUMMARY OF THE INVENTION

The problem solved by the present invention is providing a semiconductor device and a method for fabricating the same, which may increase the mobility of charge carriers in the channel.

In order to solve the problems as mentioned above, the present invention provides a method for fabricating a semiconductor device, the method comprises:

providing a germanium-based semiconductor substrate having a plurality of active regions and device isolation regions between the plurality of the active regions, wherein a gate dielectric layer and a gate over the gate dielectric layer are provided on the active regions which includes source and drain extension regions and deep source and drain regions;

performing a first ion implantation process with respect to the source and drain extension regions, wherein the ions implanted in the first ion implantation process include silicon or carbon;

performing a second ion implantation process with respect to the source and drain extension regions;

performing a third ion implantation process with respect to the deep source and drain regions;

performing an annealing process with respect to the germanium-based semiconductor substrate which has been subjected to the third ion implantation process.

The germanium-based semiconductor substrate is of P-type, and N-type impurities are implanted during the second ion implantation process and/or the third ion implantation process.

The germanium-based semiconductor substrate includes a germanium substrate, a germanium-on-insulator substrate, or a silicon-based epitaxial germanium substrate.

The N-type impurities include one or more selected from the group of P, As and Sb.

The annealing process is a rapid thermal annealing.

The doping dosage of the first ion implantation process is 1e13 to 1e16 atom/cm$^2$.

The doping dosage of the third ion implantation process is 5e14 to 1e16 atom/cm$^2$.

After performing the silicon or carbon implantation into the source and drain extension regions, a uniaxial tensile stress in a direction parallel to the channel and a compressive stress in a direction perpendicular to the channel plane are introduced in the germanium channel.

The method further comprises forming sidewalls on both sides of the gate, before the step of performing the annealing process with respect to the germanium-based semiconductor substrate which has been subjected to the third ion implantation process.

Accordingly, the present invention further provides a semiconductor device comprising:

a germanium-based semiconductor substrate, a plurality of active regions in the germanium-based semiconductor substrate and device isolation regions device between the plurality of the active regions, and a gate dielectric layer on the active regions and a gate over the gate dielectric layer, wherein the active regions includes source and drain extension regions and deep source and drain regions;

characterized in that silicon or carbon impurities are contained in the source and drain extension regions;

the silicon or carbon impurities are doped into the source and drain extension regions by performing a first ion implantation process with respect to the source and drain extension regions.

Compared with the prior art, the technical solutions as described above possess the following advantages:

The present invention provides a semiconductor device and a method for fabricating the same. Taking the germanium-based NMOS transistor as an example, a uniaxial tensile stress is effectively introduced into the channel of the germanium-based NMOS transistor while a compressive stress is introduced in the direction perpendicular to the channel plane by properly altering the process procedure of the germanium-based NMOS transistor. In particular, before forming the conventional source and drain extension structure, silicon or carbon impurities are implanted (that is, the first ion implantation process) before the implantation in the source and drain extension regions (that is, the second ion implantation process), and the silicon or carbon impurities are annealed and activated together with the impurities implanted subsequently in deep source and drain regions (that is, the third ion implantation process). Compared with the prior art, the semiconductor device according to the present invention and the method for fabricating the same provide the following five advantages: Firstly, as for the germanium-based NMOS transistor, the radius of atoms of the silicon or carbon impurities applied is smaller than that of germanium, and introducing the silicon or carbon impurities into the source and drain extension regions by implantation may result in mismatch in lattices, and thus may introduce the uniaxial tensile stress in the direction parallel to the channel and the compressive stress in the direction perpendicular to the channel plane into the germanium channel, wherein both kinds of the stress may improve the mobility of electrons. Secondly, since silicon or carbon is implanted directly into the source and drain extension regions, the stress is applied to the germanium channel more directly compared with the method of depositing a thin film over the active region, so that the stress is introduced more effectively. The introduction of the stress may increase the current driving capability of the device and enhance the performance of the NMOS transistor remarkably without altering the other conditions of the device. Thirdly, the implantation of silicon or carbon impurities may prevent certain impurities (such as P, As or Sb), particularly, the impurities whose leading mechanism is substitutional diffusion, from diffusing in germanium. In this way, after activated by annealing, the implantation of silicon or carbon impurities suppresses diffusion of such impurities, so that a shallow junction is easily formed. Fourthly, since the solid solubility of N-type impurities in silicon is much larger than that in germanium, the implantation of silicon impurities may improve the solid solubility of N type impurities in source and drain extension structure to a certain degree, which is also advantageous to the forming of the shallow junction. Fifthly, the present invention introduces stress by optimizing the method of the process, which may introduce relatively large stress and obtain better performance of the device without increasing the complexity of the process, and this is an economic and effective method for improving the performance of the germanium-based NMOS device.

Therefore, the above mentioned semiconductor device and the method for fabricating the same may improve the mobility of the charge carriers in the channel, so that the electrical performance of the semiconductor device can be improved remarkably.

BRIEF DESCRIPTION OF THE DRAWINGS

With reference to the drawings, other objectives, features and advantages of the present invention described above will be clearer. In all drawings, the same reference number represents the same part. The drawings are not scaled in proportion to the actual size, but are provided for illustrating the main purpose of the present invention.

DETAILED DESCRIPTION OF THE EMBODIMENTS

Figure 1A:
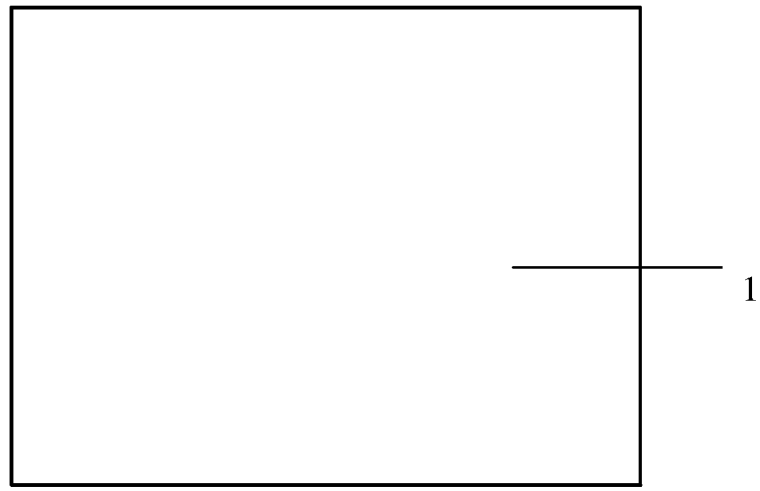
FIGS. 1(a) to 1(i) are schematic diagrams illustrating a method for fabricating the germanium-based NMOS transistor according to a preferred embodiment of the present invention.

The embodiments of the present invention will be described below in detail with reference to the accompanying drawings, so that the objectives, features and advantages of the present invention described above will be more obvious and easily to be understood.

A lot of specific details are illustrated hereinafter, so as to facilitate fully understanding of the present invention. However, the present invention may be embodied in other forms different from those described herein, and similar developments may be made by those skilled in the art without departing from the spirit of the present invention. Therefore, the present invention is not limited to the embodiments disclosed herein.

Moreover, the present invention is described in detail with reference to the schematic diagrams. When the embodiments of the present invention are described in detail, for the convenience of illustration, the section views illustrating the structure of the device may be partially enlarged and may not be in normal scale. Furthermore, the schematic diagrams are only exemplary, and should not be construed to limit the scope of the present invention. In addition, three-dimensional (3D) space including length, width and depth should be included in practical fabrication.

As described in the background of the present invention, after studying, the inventors have found that, if the strain technology is applied on the germanium-based device properly, the problem of deterioration of the mobility of the device may be solved by combining the advantages of both the novel material for channel and the strain technology, and the current driving capability of the device may be further enhanced, and thus the performance of the device may be improved. If appropriate stress can be introduced during the fabrication of the device by optimizing the process without increasing the complexity of the process, the performance of the germanium-based transistor can be improved greatly.

Based on this fact, the present invention provides a novel semiconductor device and a method for fabricating the same, which may introduce a uniaxial tensile stress in the direction parallel to the germanium channel and simultaneously introduce a compressive stress in the direction perpendicular to the channel plane by applying the method of inducing stress through process, and the mobility of charge carriers in the germanium channel can be increased.

The semiconductor device according to the present invention comprises:

A germanium-based semiconductor substrate, a plurality of active regions in the germanium-based semiconductor substrate and device isolation regions between the plurality of the active regions, a gate dielectric layer on the active regions and a gate on the gate dielectric layer, wherein both sides of the gate are preferably provided with sidewalls. The active regions include source and drain extension regions and deep source and drain regions. The source and drain extension regions are formed through a first ion implantation process and a second ion implantation process; the deep source and drain regions are formed through a third ion implantation process.

Wherein, silicon or carbon impurities are contained in the source and drain extension regions; the silicon or carbon impurities are doped into the source and drain extension regions by performing the first ion implantation process with respect to the source and drain extension regions.

If the germanium-based semiconductor substrate is of P-type, N type impurities are implanted during the second and the third ion implantation process. And, if the germanium-based semiconductor substrate is of N-type, P type impurities are implanted during the second and the third ion implantation process. The plurality of active regions which are doped are used to form channels, source regions and drain regions.

The germanium-based semiconductor substrate includes a bulk germanium substrate, a germanium-on-insulator substrate, or a silicon-based epitaxial germanium substrate. The structure of the semiconductor device may be a conventional structure, a recessed source and drain structure or a raised source and drain structure, wherein source and drain of Ge:C, Ge:Si:C or Si:C may be adopted.

The method for fabricating the semiconductor device as described above comprises:

providing a germanium-based semiconductor substrate having a plurality of active regions and device isolation regions between the plurality of the active regions, wherein a gate dielectric layer and a gate on the gate dielectric layer are provided on the active regions, wherein the active regions include source and drain extension regions and deep source and drain regions;

performing a first ion implantation process with respect to the source and drain extension regions, wherein the ions implanted during the first ion implantation process include silicon or carbon; preferably, silicon implantation is adopted during the first ion implantation process, and the doping dosage of silicon is 1e13 to 1e16 atom/cm$^2$. In addition, the C impurities may also be adopted, and the doping dosage is also 1e13 to 1e16 atom/cm$^2$.

Performing a second ion implantation process with respect to the source and drain extension regions; wherein, P, As or Sb may be doped through the second ion implantation process, and the doping dosage is 1e13 to 5e14 atom/cm$^2$.

Performing a third ion implantation process with respect to the deep source and drain regions; wherein, P, As or Sb may be doped through the third ion implantation process, and the doping dosage is 5e14 to 1e16 atom/cm$^2$.

And, performing an annealing process with respect to the germanium-based semiconductor substrate which has been subjected to the third ion implantation process. For example, the annealing process is a rapid thermal annealing, and preferably, the temperature of the thermal annealing is 300° C. to 800° C. The annealing process is not limited to the rapid thermal annealing, and may also be a conventional annealing process or a novel annealing process developed in the future, such as laser annealing or flash annealing, or the like.

Hereinafter, taking the germanium-based NMOS transistor as an example, the embodiments of the semiconductor device according to the present invention and the method for fabricating the same are illustrated in detail with reference to the accompanying drawings.

Figure 1B:
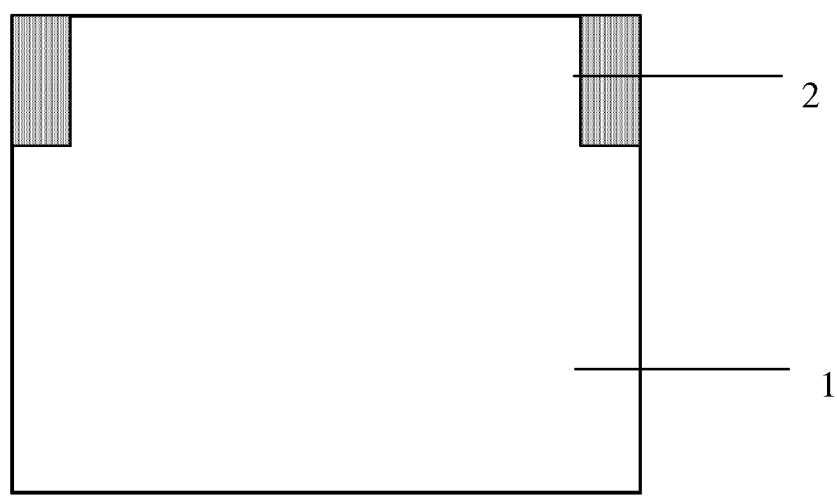
Figure 1C:
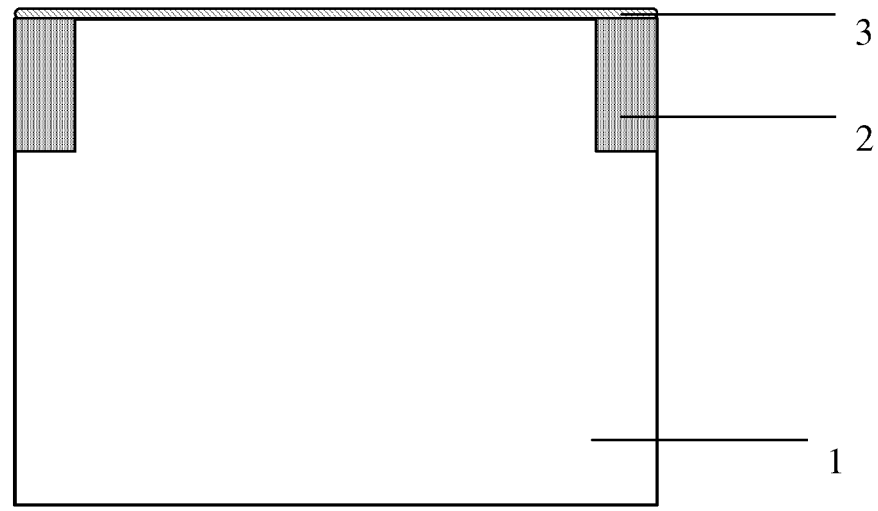
Figure 1D:
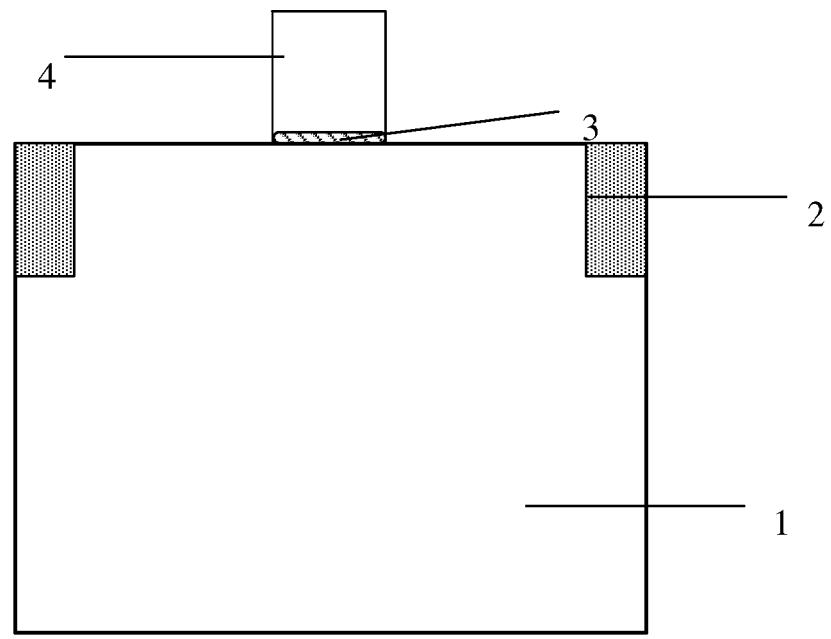
Figure 1E:
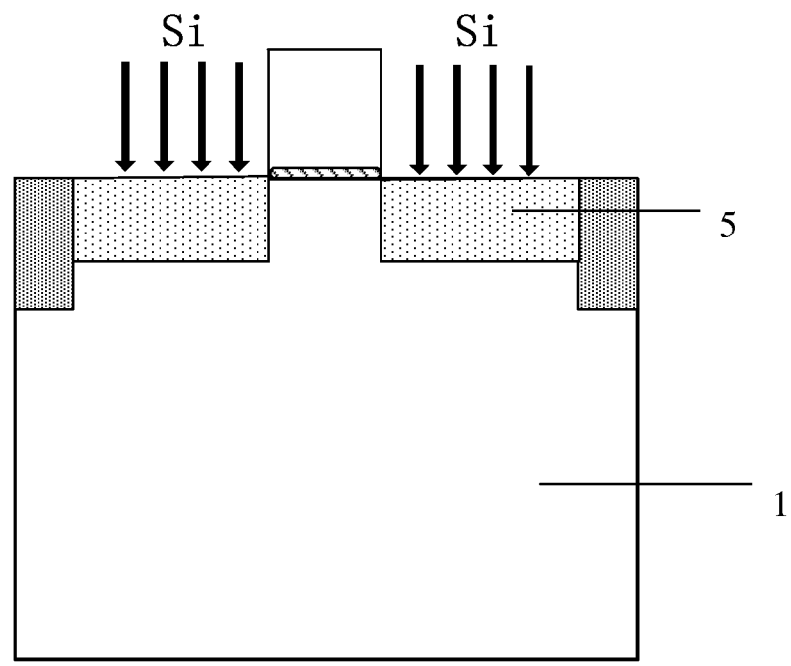
Figure 1F:
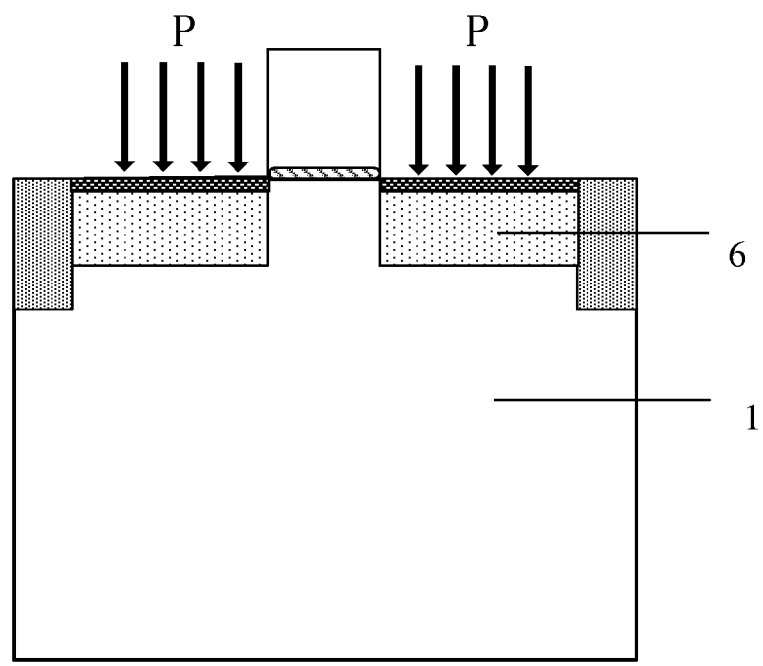
Figure 1G:
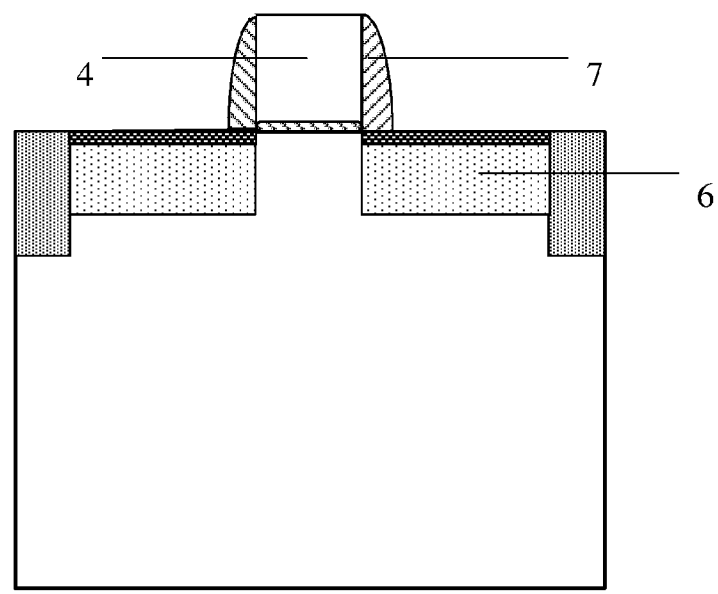
Figure 1H:
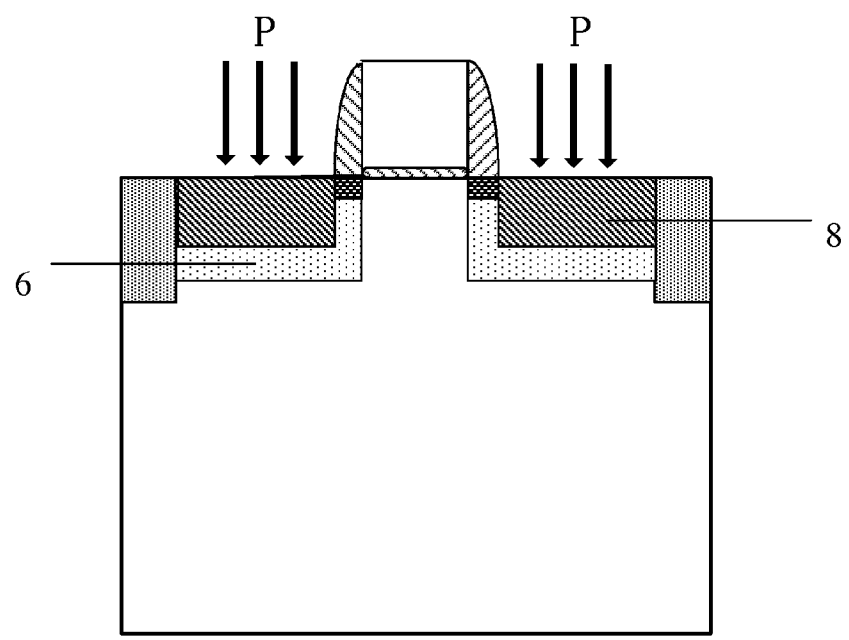
Figure 1I:
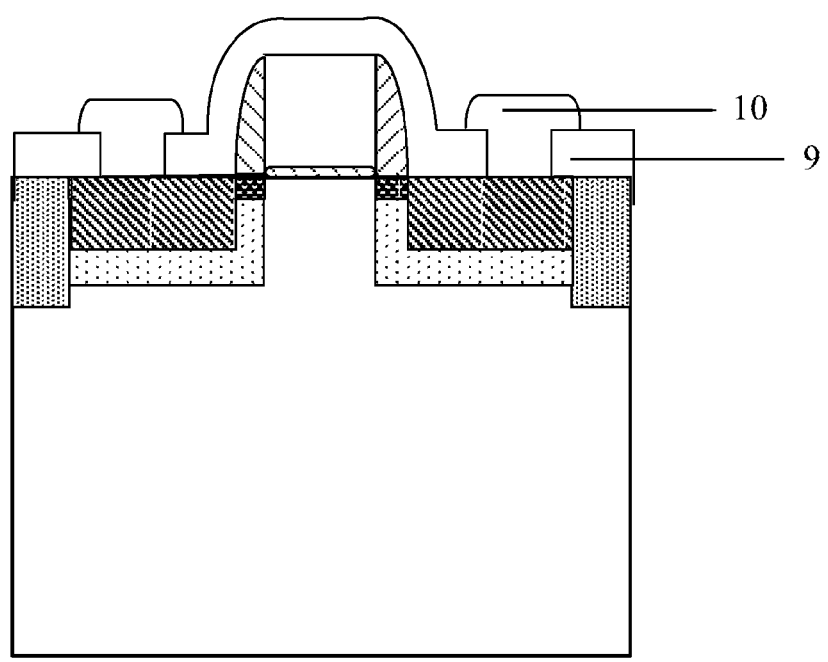
Figure 2:
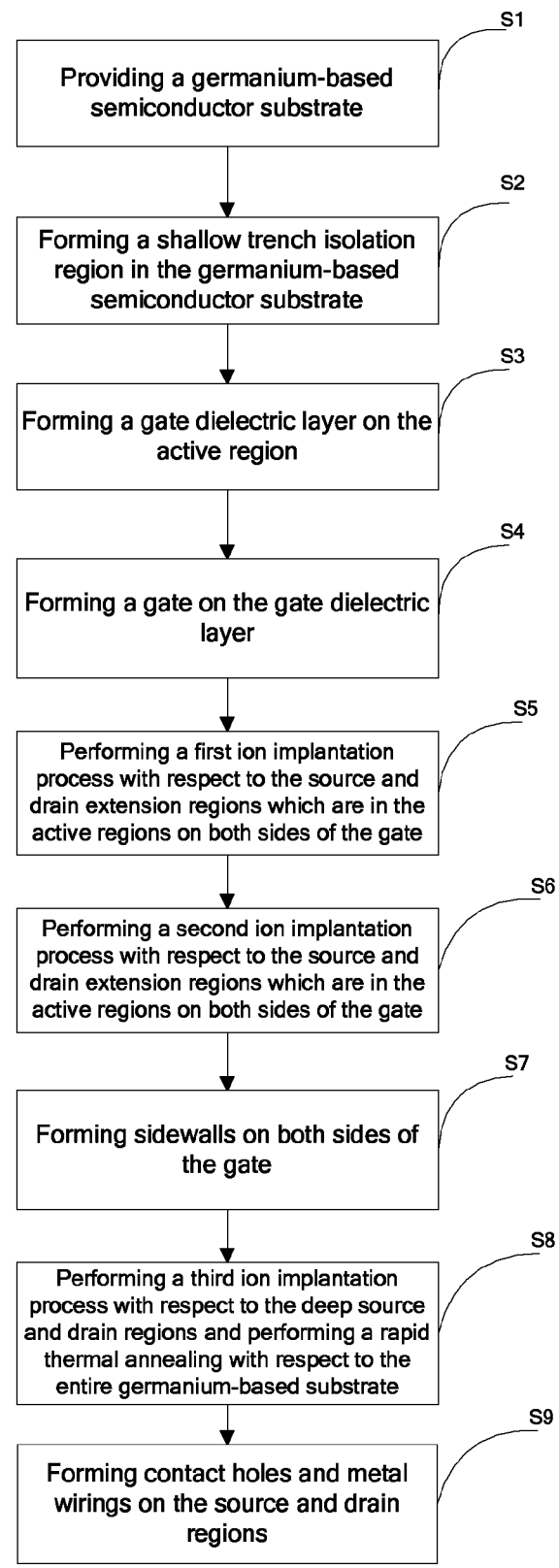
FIG. 2 is a flow chart illustrating the method for fabricating the germanium-based NMOS transistor according to a preferred embodiment of the present invention.

FIGS. 1(a) to 1(i) are schematic diagrams illustrating the method for fabricating the germanium-based NMOS transistor according to a preferred embodiment of the present invention; FIG. 2 is a flow chart illustrating the method for fabricating the germanium-based NMOS transistor according to a preferred embodiment of the present invention.

As shown in FIG. 2, the method for fabricating the germanium-based NMOS transistor comprises the following steps:

Step S1: a germanium-based semiconductor substrate is provided. As shown in FIG. 1(a), a germanium-based semiconductor substrate 1 is doped with P-type impurities, wherein the germanium-based semiconductor substrate 1 may be a bulk germanium substrate, a germanium-on-insulator (GOI) substrate, or an epitaxial Ge-on-Si substrate, etc.

Step S2: a shallow trench isolation region is formed in the germanium-based semiconductor substrate. A shallow trench isolation region 2 is shown in FIG. 1(b). A silicon oxide layer and a silicon nitride layer (not shown) are deposited on the germanium-based semiconductor substrate, locations of the shallow trenches are defined by photolithography, then the silicon nitride layer and the silicon oxide layer are etched by using reactive ion etching technology, then the germanium-based semiconductor substrate is further etched to form shallow trenches, and polysilicon or silicon oxide is deposited on the germanium based substrate by using the CVD method to fill the isolation trenches. Finally, the surface is polished to be flat by using the chemical mechanical polishing (CMP) technology, so that a plurality of shallow trench isolation regions 2 are formed, and the active regions which form semiconductor devices are provided between the plurality of shallow trench isolation regions 2. The isolation of the devices is not limited to shallow trench isolation (STI), and technologies such as isolation using field oxidation and so on may also be adopted.

Step S3: a gate dielectric layer is formed on the active regions. The gate dielectric layer 3 is shown in FIG. 1(c), and the gate dielectric layer 3 may adopt silicon dioxide, high-k gate dielectric layer, germanium oxynitride or germanium dioxide. In the present embodiment, an LPCVD method is used to form a gate dielectric layer of silicon dioxide.

Step S4: a gate is formed on the gate dielectric layer. The forming of the gate may adopt a polysilicon gate, a metal gate, or a FUSI gate, or the like. In the present embodiment, as shown in FIG. 1(d), a gate 4 is formed by depositing a polysilicon gate layer (not shown), performing a dopant implantation with respect to the polysilicon gate layer to dope phosphorus impurities, and then performing photolithography and etching with respect to the polysilicon gate layer.

Step S5: a first ion implantation process is performed with respect to the source and drain extension regions which are disposed in the active regions on both sides of the gate. As shown in FIG. 1(e), by means of the method of ion implantation, silicon impurities at a mount far exceeding the normal solid solubility may be doped into the source and drain extension regions 5 in the germanium-based semiconductor substrate 1, so as to introduce a uniaxial tensile stress parallel to the germanium channel and a compressive stress perpendicular to the channel plane into the germanium channel, and meanwhile, to prevent the impurities in the source and the drain from diffusion and to increase the solid solubility of the N-type impurities. The dosage of the silicon impurities implanted is 1e13 to 1e16 atom/cm$^{-2}$.

Step S6: a second ion implantation process is performed with respect to the source and drain extension regions which are disposed in the active regions on both sides of the gate. Phosphorus impurities are selected in the present embodiment. As shown in FIG. 1(f), by means of the ion implantation of the phosphorus impurities, N-type implantation regions 6 which are relatively lightly doped are formed in the surface of the active region of the germanium-based semiconductor substrate 1 as the source and drain extension regions for reducing the electric field intensity at the drain and the channel while ensuring a relatively low resistance. The dosage of the phosphorus impurities implanted is 1e13 to 5e14 atom/cm$^{-2}$.

Step S7: sidewalls are formed on both sides of the gate. The sidewalls may be formed by depositing $SiO_2$ or $Si_3N_4$ and etching the same, and the dual sidewalls in a sequence of $Si_3N_4$ followed by $SiO_2$ may also be adopted. As shown in FIG. 1(g), in the present embodiment, self-aligned isolation structures 7 (that is, sidewalls 7) are formed on both sides of the gate 4 by depositing silicon dioxide and dry etching. The regions under the sidewalls 7 are the extension source and drain regions 6, and the regions between the extension source and drain regions 6 and the shallow trench isolation regions 2 are deep source and drain regions 8.

Step S8: a third ion implantation process is performed with respect to the deep source and drain regions and a rapid thermal annealing is performed with respect to the entire germanium-based substrate. As shown in FIG. 1(h), N-type highly doped source and drain regions 8 (deep source and drain regions) of NMOS are formed through ion implantation of phosphorus impurities. The dosage of the phosphorus impurities implanted is 5e14 to 1e16 atom/cm$^{-2}$. Subsequently, an activation thermal treatment for the impurities implanted is performed with respect to the entire germanium-based substrate 1 by using spike annealing, which facilitates to form a shallow junction, so that the silicon impurities implanted as well as the phosphorus impurities implanted at two times are activated. The annealing temperature is 300° C. to 800° C.

Step S9: contact holes and metal wirings are formed on the source and drain regions. In this process step, the parasitic resistance may firstly be reduced by choosing and using a silicide source and drain process, and then a dielectric layer 9 used for the isolation between a metal wiring layer 10 and a device layer is deposited and is subjected to a photolithography so as to form contact holes. Then, a metal layer, such as Al, Al—Ti, or the like, is formed by sputtering and is etched to define wiring patterns. After etching, patterns of metal wirings are formed, and finally, the metal wiring layer 10 is formed by alloying through a low temperature annealing process. The resultant semiconductor device according to the present invention is finally formed, as shown in FIG. 1(i).

According to the method for fabricating a semiconductor device as suggested in the present embodiment, a novel strained germanium-based NMOS transistor with better performance may be fabricated. Through the implantation of silicon impurities, appropriate stress may be introduced into the germanium channel effectively by the mismatch of lattices in the source and drain regions, so that the mobility of electrons in the channel is enhanced and the performance of the device is improved. Furthermore, the silicon impurities may prevent the phosphorus impurities from diffusing in the germanium substrate, and thus the solid solubility of phosphorus in germanium may also be increased to a certain degree, so as to facilitate the formation of the shallow junction. At the same time, the complexity of the process is substantially not increased in the present method. Therefore, compared with the conventional process and fabrication method, the semiconductor device and the method for fabricating the same as described herein may improve the performance of the germanium based NMOS transistor easily and effectively.

The contents as described above are only the preferred embodiments of the present invention, and the present invention is not limited thereto in any way. Furthermore, the semiconductor device and the method for fabricating the same may also be used for a PMOS transistor, which will not be described in detail any more herein.

Although the present invention has been disclosed in the form of preferred embodiments, the embodiments are not used for defining the scope of the present invention. Many possible changes and modifications may be made to the technical solution of the present invention or the technical solution of the present invention may be modified as an equivalent embodiment with equivalent changes by means of the method and technology disclosed above by anyone skilled in the art without departing from the scope of the technical solution of the present invention. Therefore, all the contents not departing from the technical solution of the present invention, and the simple modifications, equivalent changes and modifications made to above embodiments on the basis of the technical essence of the present invention belong to the protection scope of the technical solution of the present invention.

What is claimed is:

1. A method for fabricating a semiconductor device, characterized in that the method comprises steps of:
   providing a germanium-based semiconductor substrate having a plurality of active regions and device isolation regions between the plurality of the active regions, wherein a gate dielectric layer and a gate over the gate dielectric layer are provided on the active regions, and the active regions include source and drain extension regions and deep source and drain regions;
   performing a first ion implantation process with respect to the source and drain extension regions, wherein ions implanted during the first ion implantation process include silicon or carbon;
   performing a second ion implantation process with respect to the source and drain extension regions;
   performing a third ion implantation process with respect to the deep source and drain regions;
   performing an annealing process with respect to the germanium-based semiconductor substrate which has been subjected to the third ion implantation process.

2. The method for fabricating a semiconductor device according to claim 1, characterized in that, the germanium-based semiconductor substrate is of P-type, and N-type impurities are implanted during the second ion implantation process and/or the third ion implantation process.

3. The method for fabricating a semiconductor device according to claim 2, characterized in that, the germanium-based semiconductor substrate includes a bulk germanium substrate, a germanium-on-insulator substrate or a silicon-based epitaxial germanium substrate.

4. The method for fabricating a semiconductor device according to claim 2, characterized in that, the N-type impurities include one or more selected form P, As and Sb.

5. The method for fabricating a semiconductor device according to claim 1, characterized in that, the annealing process includes rapid thermal annealing, laser annealing or flash annealing.

6. The method for fabricating a semiconductor device according to claim 1, characterized in that, the doping dosage of the first ion implantation process is 1e13 to 1e16 atom/cm$^2$.

7. The method for fabricating a semiconductor device according to claim 1, characterized in that, the doping dosage of the third ion implantation process is 5e14 to 1e16 atom/cm$^2$.

8. The method for fabricating a semiconductor device according to claim 1, characterized in that, a uniaxial tensile stress in a direction parallel to a germanium channel and a compressive stress in a direction perpendicular to a channel plane are introduced into the germanium channel after performing the implantation of silicon or carbon to the source and drain extension regions.

9. The method for fabricating a semiconductor device according to claim 1, characterized in that the method further comprises: forming sidewalls on both sides of the gate, before the step of performing the annealing process with respect to the germanium-based semiconductor substrate which has been subjected to the third ion implantation process.

10. The method for fabricating a semiconductor device according to claim 2, characterized in that, the doping dosage of the third ion implantation process is 5×e14 to 1×e16 atom/cm².

11. A semiconductor device comprising:
a germanium-based semiconductor substrate,
a plurality of active regions in the germanium based semiconductor substrate and device isolation regions between the plurality of the active regions, and
a gate dielectric layer on the active regions and a gate on the gate dielectric layer, wherein the active regions include source and drain extension regions and deep source and drain regions;
characterized in that:
silicon or carbon impurities are contained in the source and drain extension regions; and
the silicon or carbon impurities are doped into the source and drain extension regions by performing a first ion implantation process with respect to the source and drain extension regions.

* * * * *